United States Patent [19]

Chandrasekhar

[11] Patent Number: 4,553,318

[45] Date of Patent: Nov. 19, 1985

[54] METHOD OF MAKING INTEGRATED PNP AND NPN BIPOLAR TRANSISTORS AND JUNCTION FIELD EFFECT TRANSISTOR

[75] Inventor: Hosekere S. Chandrasekhar, Whitehouse Station, N.J.

[73] Assignee: RCA Corporation, Princeton, N.J.

[21] Appl. No.: 490,954

[22] Filed: May 2, 1983

[51] Int. Cl.[4] .................................... H01L 21/225
[52] U.S. Cl. ................... 29/577 C; 29/576 W; 29/591; 29/571; 148/187
[58] Field of Search ............ 29/576 W, 577 C, 591, 29/571; 148/187

[56] References Cited

U.S. PATENT DOCUMENTS

| | | | |
|---|---|---|---|
| 3,374,125 | 3/1968 | Goldsmith | 148/189 |
| 3,852,802 | 12/1974 | Wolf et al. | 148/175 X |
| 3,954,522 | 5/1976 | Roberson | 148/175 |
| 4,050,031 | 9/1977 | Gray et al. | 330/24 |
| 4,103,188 | 7/1978 | Morton | 307/251 |
| 4,260,431 | 4/1981 | Piotrowski | 29/576 W |
| 4,299,024 | 11/1981 | Piotrowski | 29/577 C |
| 4,314,267 | 2/1982 | Bergeron et al. | 357/43 |
| 4,325,180 | 4/1982 | Curran | 29/571 |
| 4,462,149 | 7/1984 | Schwabe | 29/571 |
| 4,481,707 | 11/1984 | Cunniff | 29/580 |

Primary Examiner—George T. Ozaki
Attorney, Agent, or Firm—Birgit E. Morris; Donald S. Cohen; James M. Trygg

[57] ABSTRACT

A semiconductor device and method for making same having three transistors, NPN, PNP, and junction field effect, concurrently formed integral to a common semiconductor device.

7 Claims, 13 Drawing Figures

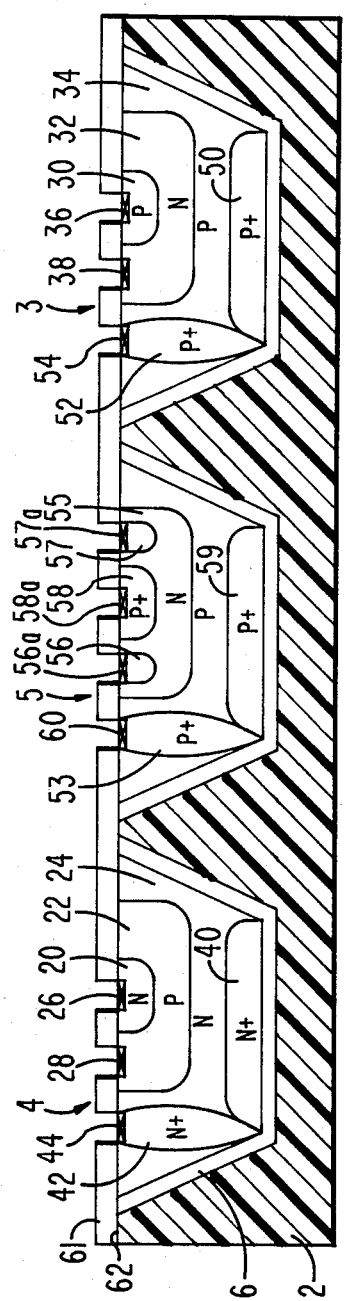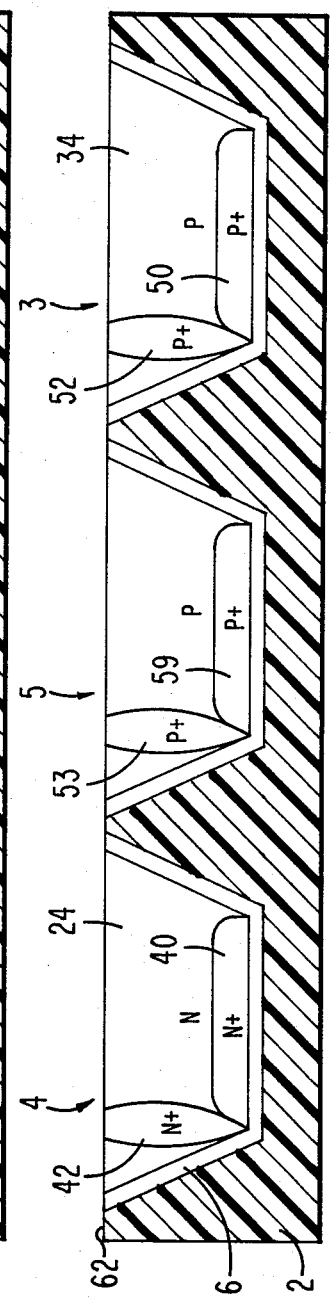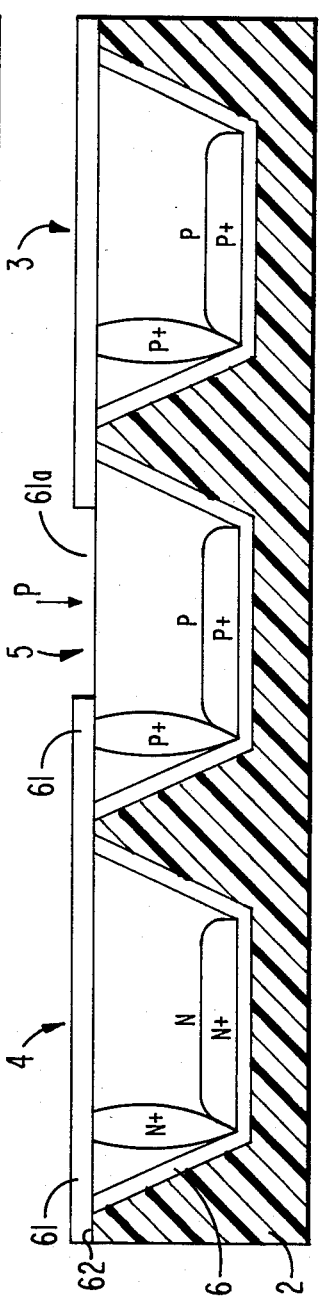

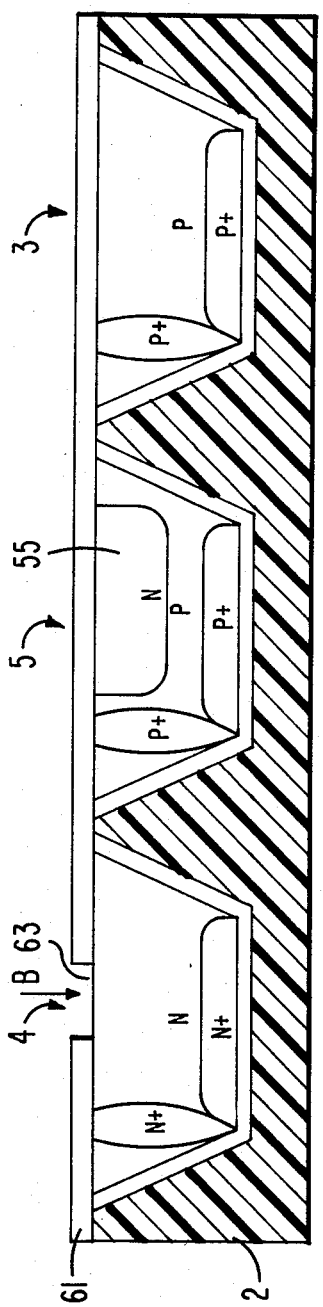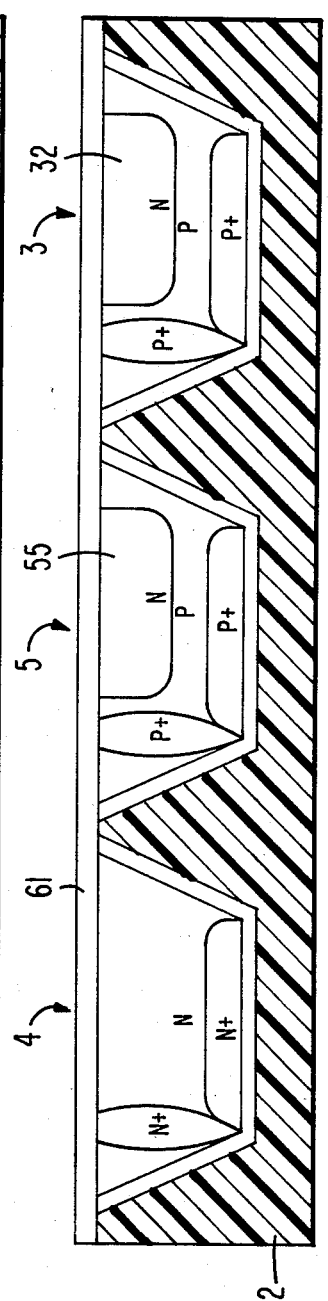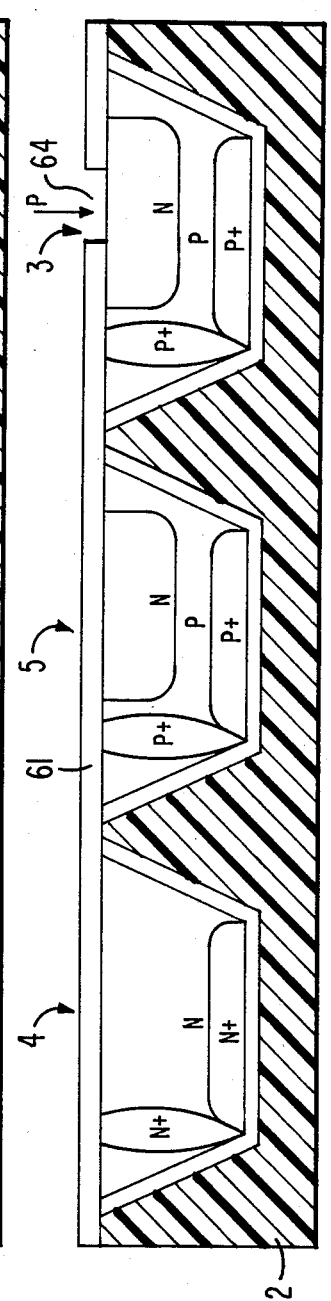

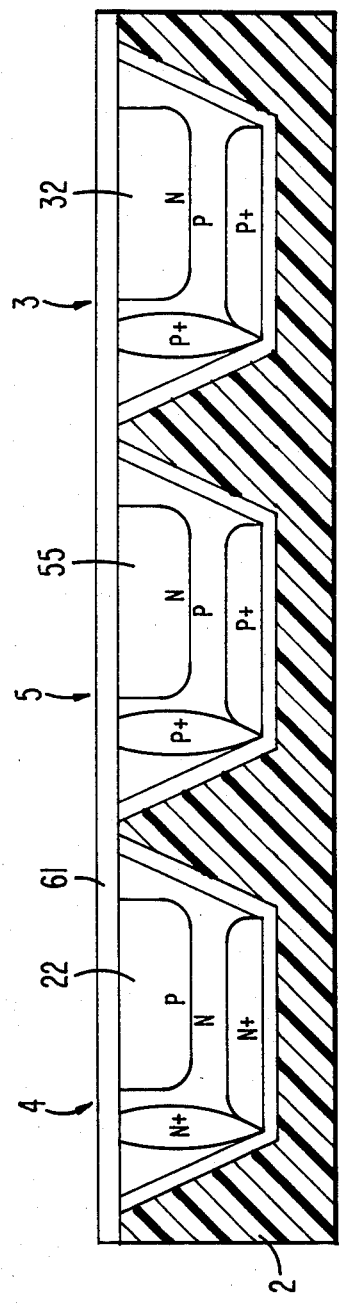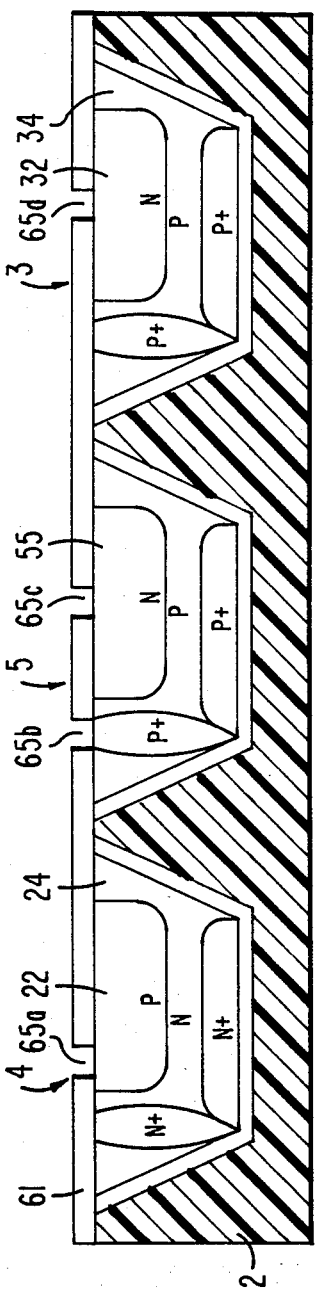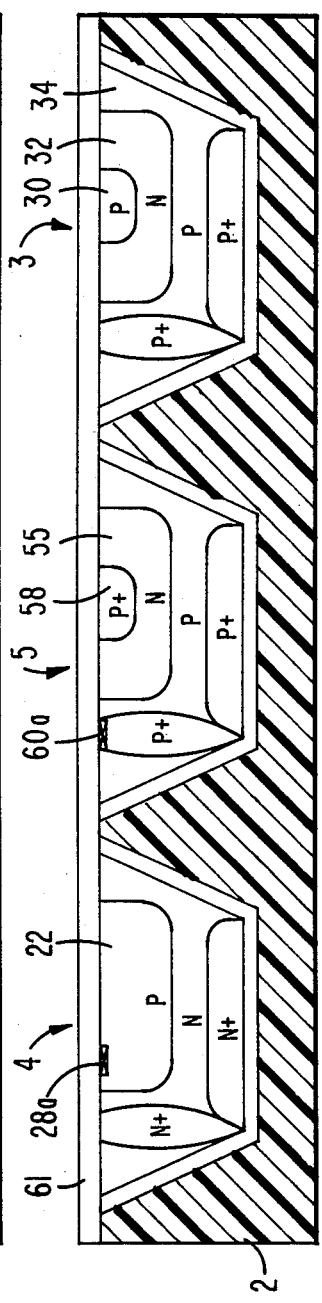

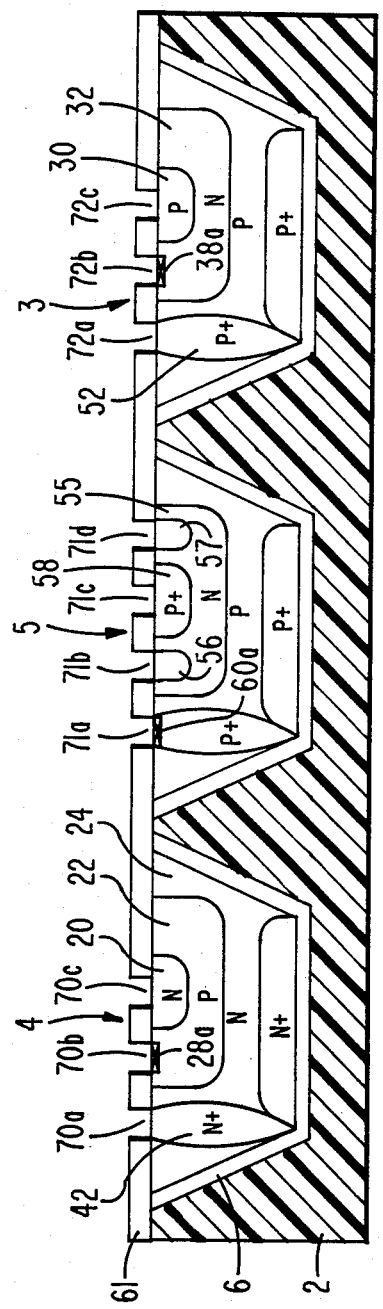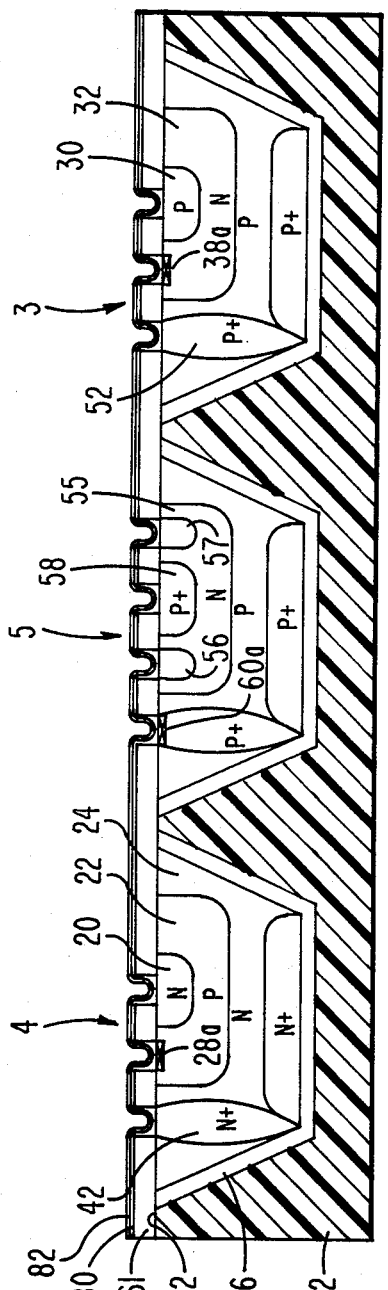
Fig. 12
Fig. 13

METHOD OF MAKING INTEGRATED PNP AND NPN BIPOLAR TRANSISTORS AND JUNCTION FIELD EFFECT TRANSISTOR

The present invention relates to semiconductor devices having a junction field effect transistor and both a PNP and NPN transistor formed integral thereto.

Semiconductor devices having both PNP and NPN transistors formed on the same substrate are common in the prior art, as are semiconductor devices having junction field effect transistors (JFETs). However, the combination of a triplet of PNP, NPN, and junction field effect transistors has heretofore not been manufactured due to the difficulty of forming the p+ gate of the JFET without altering or completely destroying the p type base of the NPN transistor or the emitter of the PNP transistor. The converse is, of course, also true. That is, if the JFET is formed first, then it is difficult to form the p material of the PNP or NPN transistors without adversely affecting the JFET. The only instance of a JFET being combined with NPN and PNP transistors, of which this inventor is aware, is that disclosed in U.S. Pat. No. 4,314,267 issued Feb. 2, 1982 to Bergeron et al. What was disclosed there was a semiconductor device having a JFET and bipolar transistor which share a common base and drain and a common collector and gate in the p type base region of what would otherwise have been an NPN transistor. What is needed is a device, and method for making same wherein three independent transistors, one unipolar JFET and one each of a bipolar PNP and NPN type transistor are concurrently formed on the same semiconductor device.

SUMMARY OF THE INVENTION

According to the present invention a semiconductor device is disclosed having a substrate and a plurality of spaced apart well or conductive regions formed therein. An insulating means is provided for dielectrically isolating the conductive regions from each other and from the substrate. Two of the conductive regions contain bipolar transistors, one of PNP type and the other of NPN type while a third conductive region contains a JFET.

BRIEF DESCRIPTION OF THE DRAWINGS

FIG. 1 is a schematic representation of a cross sectional view of a portion of a semiconductor device showing the teachings of this invention.

FIGS. 2 through 13 are views similar to that of FIG. 1 showing various steps of manufacture of the semiconductor device.

DESCRIPTION OF THE PREFERRED EMBODIMENT

Figure 10:
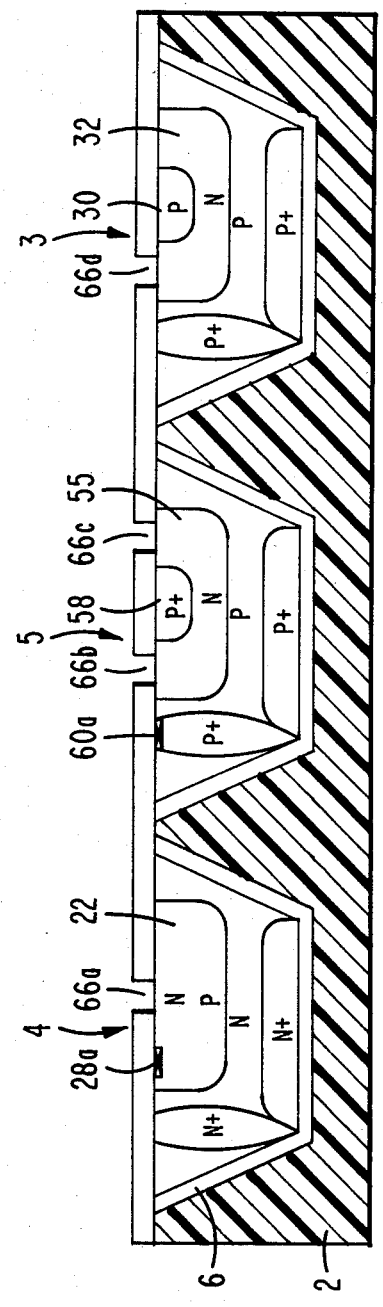

Referring to FIG. 1 there is shown a portion of an integrated circuit in cross section including a substrate 2 and three spaced apart silicon wells or conductivity regions 3, 4, and 5. It will be understood that a typical integrated circuit will contain many more such wells, however, for simplicity only three wells are shown to illustrate the teachings of the present invention. Each of the wells 3, 4 and 5 are dielectrically isolated from the substrate 2 and from each other by a layer 6 of silicon dioxide or some other suitable dielectric material. The well 4 is an NPN transistor having an n type emitter region 20, a p type base region 22 and an n type collector region 24. A pair of contacts 26 and 28 form electrical connections to the emitter region 20 and base region 22, respectively. A collector contact is made through an n+ type buried layer region 40, an n+ type deep collector diffusion region 42 and a contact 44 on the surface of the integrated circuit. The well 3 contains a PNP transistor having a p type emitter region 30, an n type base region 32 and a collector region 34. A pair of contacts 36 and 38 form electrical connections to the emitter region 30 and the base region 32, respectively. A collector contact is made through a p+ type buried layer region 50, a deep p+ type collector diffusion region 52 and a contact 54 on the surface of the integrated circuit. The well 5 is an n channel junction field effect transistor having an n type channel 55, an n+ type source region 56, an n+ type drain region 57, a top p+ type gate region 58, and an electrically shorted bottom P+ type gate region 59 communicating through a p+ type deep diffusion region 53 to a contact 60 on the surface 62 of the integrated circuit.

A layer of silicon dioxide 61 is arranged in intimate contact with the surface of the substrate 2 and extends over the wells 3, 4, and 5, thereby completely covering the surface of the semiconductor device except for the contacts 26, 28 and 44 in the well 4, the contacts 36, 38 and 54 in the well 3, and the contacts 56a, 57a, 58a, and 60 in the well 5.

Turning now to the method of manufacturing the semiconductor device of the present invention, the reader is referred to FIGS. 2 through 13.

The device shown in FIG. 2 is a polished wafer having three dielectrically isolated wells 3,4, and 5 formed in a substrate 2; wells 3 and 5 being of p type conductivity material and well 4 being of n type conductivity material. Such wafers are well known in the art as are the methods for making them. For more detailed information on the structure and methods of manufacture of such devices, the reader is referred to U.S. Pat. No. 3,852,802, issued on Dec. 3, 1974 to Wolf et al. and U.S. Pat. No. 3,954,522, issued on May 4, 1976 to Roberson. For purposes of this disclosure, the device shown in FIG. 2 is presumed to be easily obtainable by one skilled in the art and therefore will represent the starting point in describing the semiconductor device of the present invention and the method for making same.

Referring to FIG. 3, a relatively thick insulating layer 61, which may be silicon dioxide for example, is deposited or otherwise formed on a surface 62 of the substrate 2. An opening 61a is then etched in the layer 61, through a suitable mask, directly over the well 5 as shown in FIG. 3. Phosphorus of the order of $3.5 \times 10^{12}$ atoms/cm$^2$ at 100 Kev is implanted in the well 5 through the opening 61a and thermally driven to form the n type channel 55 of the junction field effect transistor in the well 5 as shown in FIG. 4. The diffusion process restores the layer of silicon dioxide 61 directly over the channel 55. An opening 63 is etched through the layer 61 over the well 4, as shown in FIG. 4, and boron oxide is deposited by vapor deposition from a boron nitride source, as described in U.S. Pat. No. 3,374,125, issued Mar. 14, 1968 to Goldsmith, and driven to form the p base 22 in the well 4 as shown in FIG. 5. The layer 61 of silicon dioxide is again restored by the diffusion process directly over the base 22. An opening 64 is then made in the layer 61 over the well 3, as shown in FIG. 6, and phosphorus of the order of $5 \times 10^{13}$ atoms/cm$^2$ at 100 Kev is implanted and thermally driven to form the n type base 32 in the well 3 as shown in FIG. 7. The layer 61 of silicon dioxide is again restored by the diffusion process directly over the base 32.

Figure 11:
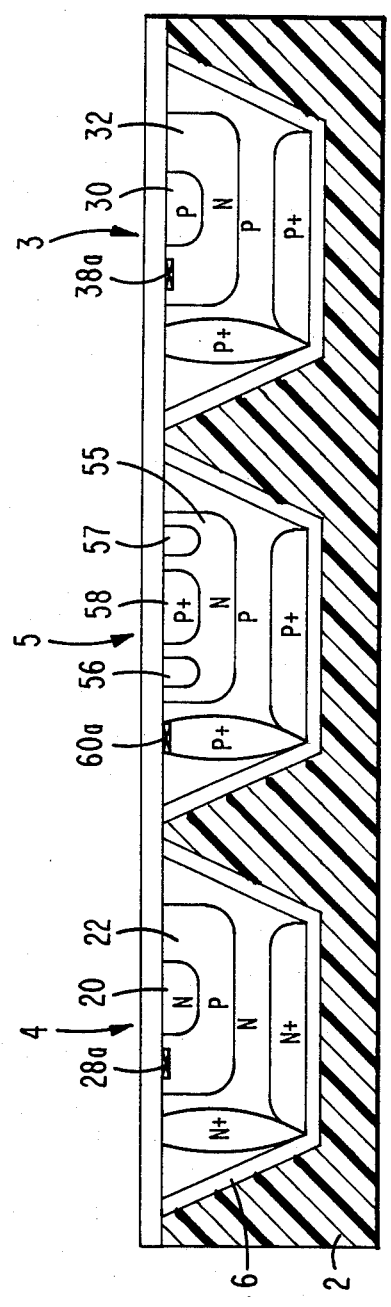

Four openings 65a, 65b, 65c and 65d are made in the layer 61, as shown in FIG. 8, and boron oxide is deposited by vapor deposition from a boron nitride source and thermally driven to form the top gate 58 and the bottom gate contact area 60a in the well 5, the emitter 30 in the well 3, and the base contact area 28a in the well 4, as shown in FIG. 9. The layer 61 of silicon dioxide is again restored by the diffusion process. Four openings 66a, 66b, 66c and 66d are made in the layer 61, as shown in FIG. 10, and phosphorus is deposited and thermally driven therein to form the emitter 20 in the well 4, the source 56 and the drain 57 of the junction field effect transistor in the well 5, and the base contact area 38a in the well 3, as best seen in FIG. 11. The layer 61 is again restored by the diffusion process.

Referring to FIG. 12, three openings 70a, 70b, and 70c are formed in the layer 61 directly over the deep collector diffusion region 42, the base contact area 28a, and the emitter 20, respectively, in the well 4, four openings 71a, 71b, 71c and 71d over the bottom gate contact area 60a, the source 56, the top gate 58 and the drain 57 respectively in the well 5, and three openings 72a, 72b, and 72c over the deep collector diffusion region 52, the base contact area 38a, and the emitter 30 respectively, in the well 3. A layer of platinum, not shown, having a thickness of approximately 700 Angstroms is then formed on the entire surface of the semiconductor device by platinum sputtering techniques well known in the art. The device is then heated to a temperature of approximately 625° C. for approximately 13 minutes, whereupon the platinum alloys with the surfaces of the device exposed by the openings 70a, 70b, 70c, 71a, 71b, 71c, 71d, 72a, 72b, and 72c, forming platinum silicide. The residual platinum is then etched away from the device using aqua regia as is well known in the art.

A layer 80 of titanium having a thickness of approximately 2000 Angstroms is formed on the entire surface of the device including the platinum silicide surfaces. A layer 82 of aluminum having a thickness of approximately 15,000 Angstroms is then formed on the layer 80 of titanium, as shown in FIG. 13. These layers of titanium and aluminum are formed in any conventional but suitable manner well known in the art such as sputtering or evaporation. The layers 80 and 82 of titanium and aluminum are then removed from all areas of the semiconductor device except those areas over the platinum silicide surfaces thereby forming electrical contacts at 44, 28, 26 in the well 4; 60, 56a, 58a and 57a in the well 5; and 54, 38, and 36 in the well 3, as best seen in FIG. 1. The individual elements formed in the plurality of wells of the semiconductor device may be electrically interconnected by metal conductors, not shown, formed by metallization techniques that are well known by those skilled in the art or any other suitable method. Finally, the semiconductor device is passivated by depositing a layer of phosphorus silicate glass (PSG) over the entire device (not shown).

What is claimed is:

1. A method of forming a semiconductor device comprising the steps of:

(a) forming a plurality of spaced apart conductive wells in the surface of a substrate, each of said wells being dielectrically isolated from said substrate, a first of said wells being of first conductivity type material and a second and third of said wells being of a second conductivity type material, each of said wells having a deep diffusion region and a buried layer region in electrical communication therewith;

(b) forming a channel of said first conductivity type material in said second well;

(c) forming a base of said second conductivity type material in said first well;

(d) forming a base of said first conductivity type material in said third well;

(e) forming concurrently a top gate of said second conductivity type material and a bottom gate contact area in said second well, an emitter of said second conductivity type material in said third well, and a base contact area in said first well;

(f) forming an emitter of first conductivity type material in said first well, a source and a drain of first conductivity type material in said second well, and a base contact area in said third well;

(g) forming a layer of platinum: said deep diffusion region, said base contact area, and said emitter of said first well;

said deep diffusion region, said source, said top gate, and said drain in said second well; and said deep diffusion region, said base contact, and said emitter in said third well;

(h) alloying said platinum layer of step (g) with the surface of said substrate to form platinum silicide; and (i) forming a plurality of electrical contacts, one on each platinum silicide surface.

2. The method as set forth in claim 1 wherein step (i) includes the steps of forming a layer of titanium on the surfaces of said platinum silicide and forming a layer of aluminum on said layer of titanium.

3. The method as set forth in claim 2 wherein said channel of step (b) is formed by phosphorus implantation and thermally driven; said base of step (d) is formed by deposition of boron oxide from a boron nitride source and thermally driven; said base of step (c) is formed by phosphorus implantation; and said top gate, bottom gate contact area, emitter, and base of step (e) are formed by deposition of boron oxide from a boron nitride source and thermally driven.

4. The method as set forth in claim 3 wherein said emitter, said source, said drain, and said base contact area of step (f) are formed by phosphorus deposition process and thermally driven.

5. The method as set forth in claim 4 wherein said layer of platinum of step (g) is formed by sputtering and said alloying of step (h) is effected by heating said substrate to a temperature of about 625° C. for a period of time of about 13 minutes.

6. The method as set forth in claim 5 wherein said layer of platinum is formed to a thickness of approximately 700 Angstroms, said layer of titanium is formed to a thickness of approximately 2000 Angstroms, and said layer of aluminum is formed to a thickness of approximately 15,000 Angstroms.

7. The method as set forth in claim 6 including a final step of passivating said semiconductor.

* * * * *